United States Patent [19]
Herold et al.

[11] Patent Number: 4,991,187
[45] Date of Patent: Feb. 5, 1991

[54] HIGH SPEED PRESCALER

[75] Inventors: Barry W. Herold, Boca Raton; Omid Tahernia, Coconut Creek, both of Fla.

[73] Assignee: Motorola, Inc., Schaumburg, Ill.

[21] Appl. No.: 382,592

[22] Filed: Jul. 21, 1989

[51] Int. Cl.$^5$ .................. H03K 23/48; H03K 21/02
[52] U.S. Cl. ............................... 377/48; 377/55; 377/44
[58] Field of Search .............. 377/47, 48, 49, 55, 377/56, 44, 116

[56] References Cited
U.S. PATENT DOCUMENTS 3,896,387  7/1975  Kokado ........................... 377/48
4,394,769  7/1983  Lull ................................ 377/116
4,633,194  12/1986 Kikuchi et al. .................. 377/47
4,712,224  12/1987 Nelson ............................ 377/47

Primary Examiner—John S. Heyman
Attorney, Agent, or Firm—Daniel R. Collopy; Vincent B. Ingrassia; William E. Koch

[57] ABSTRACT

An apparatus is described for the dual modulus prescaling of a high frequency signal. The apparatus comprises a dual modulus divider, second divider, synchronization circuit for providing a first modulus control signal to the dual modulus divider, and means for coupling the output of the second divider to the input of the synchronization circuit when a second modulus control signal is in a first state.

5 Claims, 3 Drawing Sheets

HIGH SPEED PRESCALER

BACKGROUND OF THE INVENTION

This invention relates generally to divider circuits, and more particularly to high speed divide-by-N/N+1 prescaler circuit.

Prescaler circuits for use in high speed dividers, frequency synthesizers, and the like are well known. A dual modulus prescaler is a counter whose division ratio can be switched from one value to another by an external control signal. That is, the prescaler can divide by first factor when the applied control signal is high, or by a second factor when the applied control sign is low. An in-depth discussion of prescalers can be found in "Phase-Locked Loops" by Dr. Ronald E. Best, copyright 1984, MacGraw-Hill Inc.

In an article entitled "A 250 MHz Dynamic CMOS Dual Modulus ($\div 8/9$) Prescaler" by Chris Groves et al., and beginning on page 110 of the minutes of the 1984 Conference on Advanced Research in VLSI, MIT, there is described a dual modulus ($\div 8/9$) prescaler for use in a digital 250 MHz CMOS programmable divider circuit. This prescaler comprises three cascaded standard CMOS inverters, one NOR gate, and three functionally distinct inverter circuits. Unfortunately, the circuit operates in a primarily sequential manner thus limiting its speed. Furthermore, use of a significant number of components further restricts speed and increases the circuit's power consumption.

In an effort to overcome this, U.S. Pat. application Ser. No. 300,449 filed Jan. 23, 1989 entitled "High Speed Prescaler" and assigned to the assignee of the present invention describes a high speed CMOS divide by 4/5 prescaler circuit including first, second, third, fourth, and fifth inverter stages. When a modulus control signal is high, the prescaler operates as five clocked inverters in series having an output which is fed back to the input of the initial stage. That is, the circuit operates as a five stage clocked ring oscillator wherein only one output changes on each clock edge. When a modulus control signal is low indicating that a divide by four is desired, the counter operates as a five stage ring oscillator for seven clock edges. On the eighth edge, feed forward circuitry forces the last three stages to change states simultaneously. While this circuit utilized fewer components and exhibited greater speed, the construction of a larger prescaler prim (e.g., a divide by 32/33) would require a large number of stages each of which would have to operate at high frequency and resulting in the consumption of a great deal of power.

SUMMARY OF THE INVENTION

It is an object of the present invention to provide an improved prescaler circuit.

It is a further object of the present invention to provide an N/N+1 prescaler circuit including synchronization.

According to a broad aspect of the invention, there is provided a high speed dual modulus prescaler circuit which includes a first dual modulus divider having a first input for receiving a first modulus control signal and a second input for receiving a clock signal. A second divider circuit has an input coupled to the output of the first divider. A synchronization circuit has an input coupled to first means which gates the output of the second divider to the first input of the first divider when a second modulus control signal is in a predetermined state.

The above and other objects, features, and advantages of the present invention will be more clearly understood from the following detailed description taken in conjunction with the accompanying drawings, and which:

DETAILED DESCRIPTION OF THE PREFERRED EMBODIMENT

Figure 1:
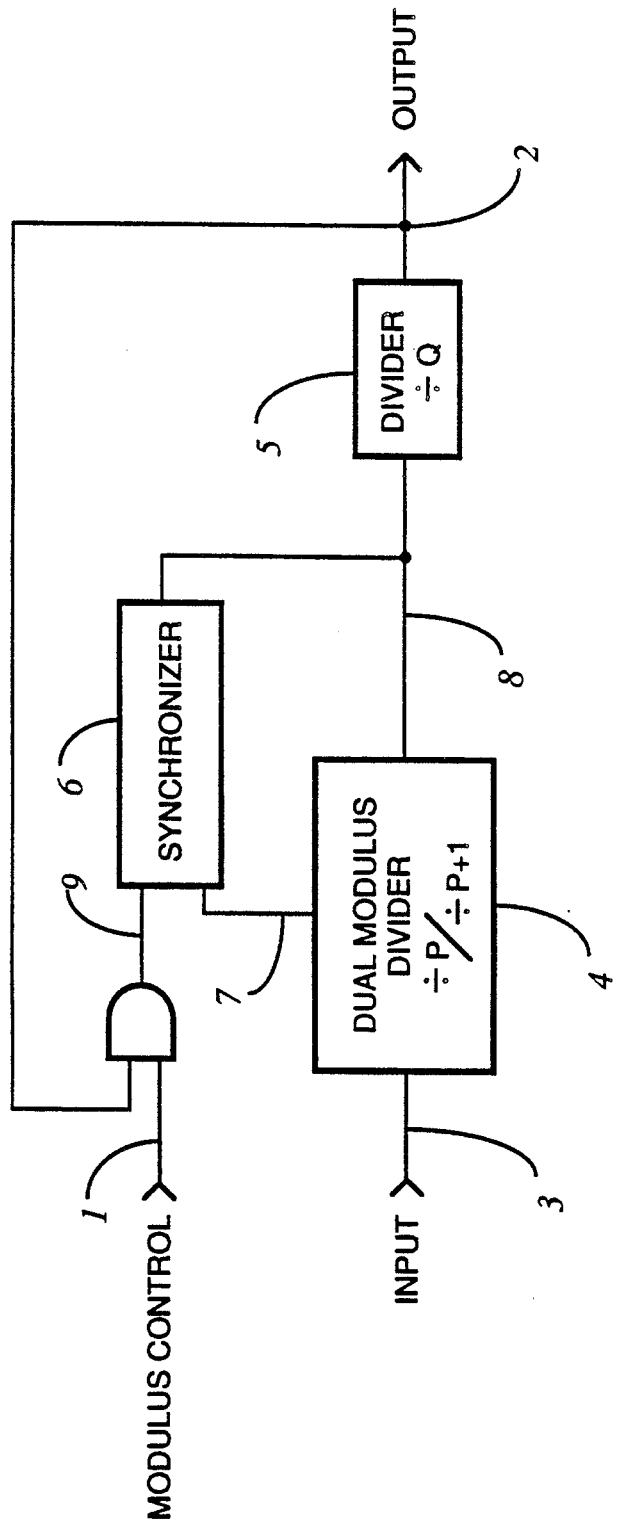
FIG. 1 is a block diagram of the invention and prescaler.

Referring to FIG. 1, a self-synchronizing dual modulus prescaler is shown. The different modulus values are selectable by enabling or disabling a modulus control signal 1. When the modulus control is disabled, the output signal frequency 2 is equal to the input clock signal frequency 3 divided by P · Q where P is the count in the dual modulus divider 4 and Q is the count in the second divider 5. Enabling the modulus control signal 1 causes the input clock signal frequency 3 division to switch from P · Q counts to (P · Q) + 1 counts for one period of P + 1 counts, where P + 1 is the count in the dual modulus divider 4 and Q is the count in the second divider 5. This gives the ability to control the overall prescaling ratio within one count of the input clock signal frequency.

The synchronizer 6 provides a modulus select signal 7 to the dual modulus divider 4 for selectable control of the modulus. The synchronizer 6 controls the setup and timing parameters for the modulus select signal 7. By deriving the clock for the synchronizer 6 from the output 8 of the dual modulus divider 4, the modulus select signal 7 is assured to have the correct timing relationship for switching the dual modulus divider 4 from one modulus to another. To insure that the dual modulus divider 4 has completed its count before switching states, the modulus control signal 1 is logically anded with the output signal 2 providing a control signal 9 to the synchronizer 6. This control signal 9 provides the proper timing to initialize the synchronizer 6 for the next count sequence by the dual modulus divider 4.

Figure 2:
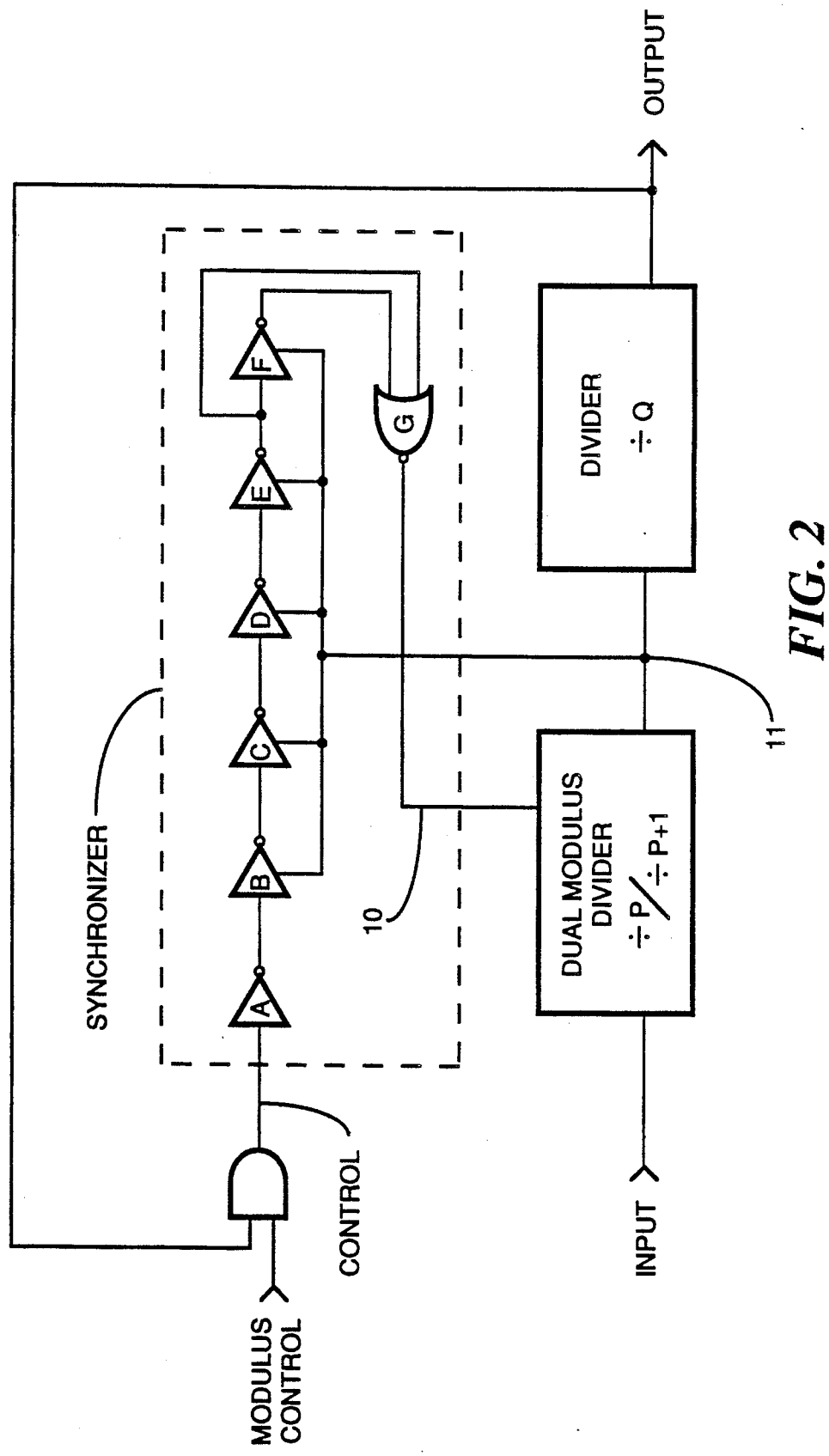
FIG. 2 is a schematic diagram detailing a preferred structure for the synchronization mechanism implemented in the prescaler of the present invention.

Referring to FIG. 2, a logic diagram of the synchronizer is shown. An input clock signal to be prescaled is coupled to the input of the dual modulus divider. The input clock signal frequency of the dual modulus divider is divided by the selected modulus to produce an output clock signal frequency. The modulus for division of the input clock signal frequency is selected by the modulus select signal 10. This modulus select signal is generated by the synchronizer. To create the modulus select signal 10, a logic signal is applied at the control connection of the synchronizer. This logic signal is inverted by inverter A and presented to the input of inverter B. On the edges of the clock signal 11, the dynamically clocked inverters B, C, D, E, and F advance the signal presented at the input of inverter B sequentially throughout the inverter chain comprising inverters B, C, D, E, and F, producing resultant signals from the outputs of inverters E and F which are applied to the inputs of NOR gate G. In the case where the sense of the logic signal at the input of inverter B is false, the output of NOR gate G creates a modulus select signal 10 which causes the dual modulus divider to divide by P counts. If the sense of the logic signal at the input of inverter B is true, the output of NOR gate G creates a modulus select signal 10 which causes the dual modulus divider to divide by P +1 counts for one P +1 period and by P counts otherwise. Because the clock signal 11 for the synchronizer is provided by the output of the dual modulus divider, correct timing of the modulus select signal 10 to the dual modulus divider is assured. The output of the dual modulus divider is coupled to the input of the divider which divides the signal frequency by Q counts resulting in the prescaled signal frequency at the output.

Figure 3:
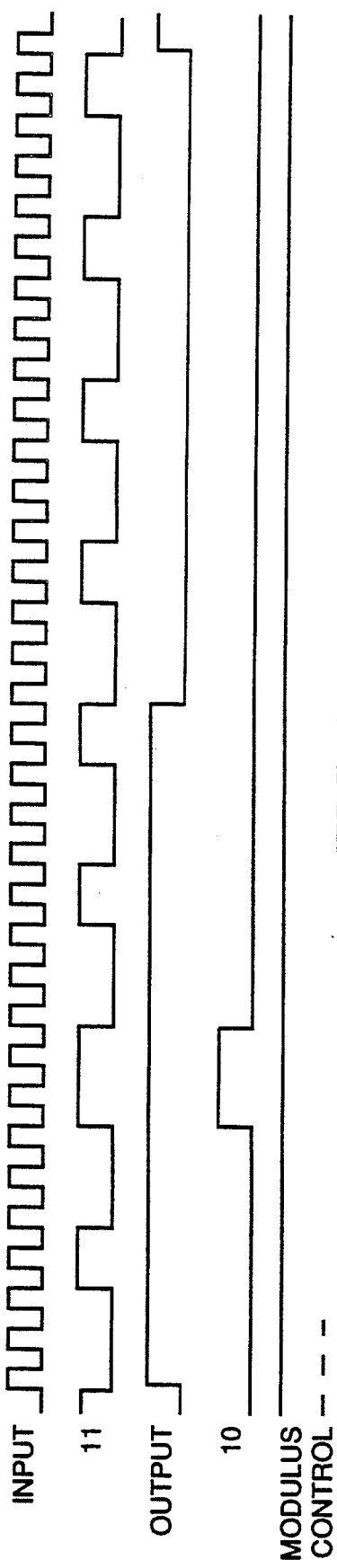
FIG. 3 is a timing diagram showing the operation in the divide by 33 mode of the invention as depicted in FIG. 2.

Referring to FIG. 3, the operation of the circuit shown in FIG. 2 is shown in its divide by 33 mode. The divide by 33 mode is selected by asserting the modulus control signal high. Internal nodes 10 and 11 are shown in order to more clearly detail the self sychronizing aspect of the synchronizer. Note that when node 10 changes state it is triggered by node 11. The output clock signal shows a positive transition when 33 periods of the input clock signal frequency have been counted, thus giving a divide by 33 prescaling of the input clock frequency.

Figure 4:
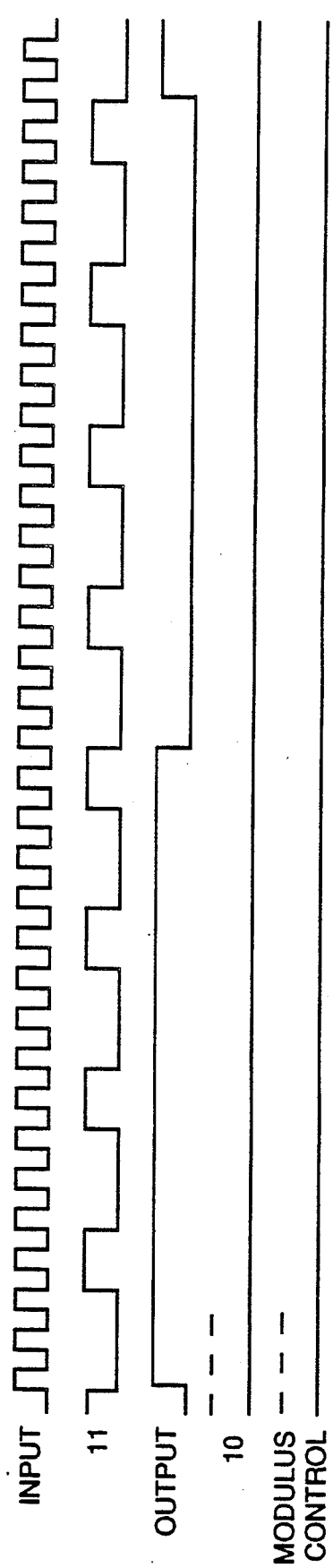
FIG. 4 is a timing diagram showing the operation in the divide by 32 mode of the invention as depicted in FIG. 2.

Referring to FIG. 4, the operation of the circuit shown in FIG. 2 is shown in its divide by 32 mode. The divide by 32 mode is selected by asserting the modulus control signal low. The output clock signal shows a positive transition when 32 periods of the input clock signal frequency have been counted, thus giving a divide by 32 prescaling of the input clock frequency.

By now it should be appreciated that there has been provided an apparatus for prescaling a high frequency signal to a lower frequency signal and for the self-synchronization of the modulus control signal to the dual modulus divider comprised within the prescaler.

What is claimed is:

1. A high speed dual modulus prescaler circuit for selecting between two frequency-division factors in response to a first modulus control signal being in a first state or a second state, comprising:
   a first dual modulus divider having a first input for receiving a second modulus control signal, a second input for receiving a clock signal, and having an output;
   a second divider having an input coupled to the output of said first dual modulus divider and having an output;
   a synchronization circuit for producing said second modulus control signal having a first input coupled to the output of said first dual modulus divider, an output coupled to the first input of said first dual modulus divider for providing said second modulus control signal thereto and having a second input; and
   first gating means for coupling the output of said second divider to the second input of said synchronization circuit when said first modulus control signal is in a first state, said first gating means having a first input for receiving said first modulus control signal, a second input coupled to the output of said second divider, and an output coupled to the second input of said synchronization circuit.

2. A circuit according to claim 1 wherein said synchronization circuit comprises:
   a plurality of series coupled clocked inverter circuits each having a clock input coupled to the output of said first dual modulus divider; and
   second gating means coupled to the output of the last of said plurality of series coupled inverters and to the output of the next to last of the plurality of series coupled inverter circuits for generating said second modulus control signal.

3. A circuit according to claim 1 wherein said first dual modulus divider is a divide-by-4/5 counter.

4. A circuit according to claim 2 wherein said first dual modulus divider is a divide-by-P/P+1 counter where P is an integer greater than or equal to 1.

5. A circuit according to claim 2 wherein said second divider includes a divide by Q where Q is an integer greater than or equal to 1.

* * * * *